US011557327B2

(12) United States Patent
Listl et al.

(10) Patent No.: US 11,557,327 B2
(45) Date of Patent: Jan. 17, 2023

(54) METHOD AND DEVICE FOR OPERATING A MEMORY ASSEMBLY

(71) Applicant: Technische Universität München, Munich (DE)

(72) Inventors: Alexandra Listl, Munich (DE); Daniel Mueller-Gritschneder, Munich (DE)

(73) Assignee: TECHNISCHE UNIVERSITÄT MÜNCHEN, Munich (DE)

( * ) Notice: Subject to any disclaimer, the term of this patent is extended or adjusted under 35 U.S.C. 154(b) by 0 days.

(21) Appl. No.: 17/292,145

(22) PCT Filed: Oct. 1, 2019

(86) PCT No.: PCT/EP2019/076585
§ 371 (c)(1),
(2) Date: May 7, 2021

(87) PCT Pub. No.: WO2020/104091
PCT Pub. Date: May 28, 2020

(65) Prior Publication Data

US 2021/0398571 A1 Dec. 23, 2021

(30) Foreign Application Priority Data

Nov. 19, 2018 (DE) ..................... 10 2018 128 980.4

(51) Int. Cl.
*G11C 7/10* (2006.01)
*G06F 7/58* (2006.01)
(Continued)

(52) U.S. Cl.
CPC ............ *G11C 7/1039* (2013.01); *G06F 7/588* (2013.01); *G11C 7/1012* (2013.01); *G11C 7/20* (2013.01); *H03K 19/21* (2013.01)

(58) Field of Classification Search
CPC ............. G06F 7/588; G06F 2212/7204; G06F 12/0246; G06F 2212/1024;
(Continued)

(56) References Cited

U.S. PATENT DOCUMENTS 6,572,024 B1 6/2003 Baldischweiler
8,645,775 B2 2/2014 Dressler et al.
(Continued)

FOREIGN PATENT DOCUMENTS

DE 19922155 A1 11/2000
DE 112008003878 T5 5/2011
(Continued)

OTHER PUBLICATIONS

International Search Report and Written Opinion relating to corresponding application PCT/EP2019/076585 dated Dec. 5, 2019 and dated Dec. 12, 2019.

*Primary Examiner* — Ajay Ojha
(74) *Attorney, Agent, or Firm* — Grossman, Tucker, Perreault & Pfleger PLLC; Steven J. Grossman

(57) ABSTRACT

The invention relates to a method for operating a memory assembly. A physical address is received. The physical address is associated with a first memory segment of a memory assembly. The physical address is modified to a modified physical address. The modified physical address is associated with a second memory segment of the memory assembly.

20 Claims, 12 Drawing Sheets

(51) Int. Cl.
*G11C 7/20* (2006.01)
*H03K 19/21* (2006.01)

(58) Field of Classification Search
CPC ..... G06F 2212/1036; G06F 2212/7211; G11C 7/1012; G11C 7/20; G11C 29/76; G11C 8/10; H03K 19/21
See application file for complete search history.

(56) References Cited

U.S. PATENT DOCUMENTS

| | | | | |
|---|---|---|---|---|
| 2004/0260934 | A1 | 12/2004 | Proll et al. | |
| 2013/0094320 | A1 | 4/2013 | Too et al. | |
| 2014/0156965 | A1* | 6/2014 | Yang | G06F 3/064 711/172 |
| 2014/0241099 | A1 | 8/2014 | Seo et al. | |
| 2019/0384706 | A1* | 12/2019 | Kao | G06F 12/0868 |

FOREIGN PATENT DOCUMENTS

| | | | |
|---|---|---|---|
| EP | 0176939 | A1 | 4/1986 |
| JP | 2011187153 | A | 9/2011 |

* cited by examiner

M

| | 0000 | 0001 | ... | 1110 | 1111 |
| --- | --- | --- | --- | --- | --- |
| 0000 | 0000 | 0001 | ... | 1110 | 1111 |
| 0001 | 0001 | 0000 | | 1111 | 1110 |
| ... | ... | ... | | ... | ... |
| 1110 | 1110 | 1111 | | 0000 | 0001 |
| 1111 | 1111 | 1110 | | 0001 | 0000 |

METHOD AND DEVICE FOR OPERATING A MEMORY ASSEMBLY

BACKGROUND OF THE INVENTION

The present disclosure relates to a method and a device for operating a memory array.

Some computing systems comprise a memory array for storing and providing data to execute a program in real time. The memory array can comprise an array of memory segments, each of which can store and provide a unit of information. Each of the memory segments can be assigned a corresponding physical address to allow a unique assignment.

The lifetime of a memory array can be affected by the total number of read and write operations performed. In particular, the lifetime of a memory array can be shortened due to ageing effects. Often, the memory segments of a memory array cannot be repaired or replaced in isolation, so that the occurrence of a failure in one of the memory segments can even lead to the failure of the entire memory array.

Uneven utilization of certain memory segments, for example, by repeatedly writing and reading more frequently than average, can therefore lead to a reduction in the lifetime of a memory array.

SUMMARY OF THE INVENTION

Against this background, an object of the present invention is to provide a method and/or a device for operating a memory array in order to have a positive effect the lifetime of the memory array.

This object is achieved by the subject matter of claim 1 and the independent claims. Advantageous examples are reproduced by the subject matter of the dependent claims.

Disclosed herein is a method for operating a memory array. According to the method, a physical address is received. The physical address is assigned to a first memory segment of a memory array. The physical address is modified into a modified physical address. The modified physical address is assigned to a second memory segment of the memory array. The memory segment that corresponds to the modified physical address can then be addressed. This allows the second memory segment to be addressed, for example, to store a memory value or to retrieve a memory value stored there.

The memory array can be configured to store data and to provide stored data for reading. In particular, the memory array can be configured to store and provide data for the execution of a program in real time. For example, the memory array can (temporarily) store memory values that are generated, retrieved, and/or processed during execution of a program.

The memory array may comprise memory cells of a volatile memory. For example, the memory array is configured to maintain stored information or stored values as long as it is in operation and/or supplied with an operating current. If the power supply is interrupted, for example, the volatile memory can maintain the stored information for a fraction of a second, or for an even longer period of time. In some examples, the memory array comprises cells of an SRAM and/or cells of a DRAM. In some examples, the memory array is part of a processor register and/or is coupled to machine-code operands of a processor. For example, the memory array is coupled to a processor unit as data memory and/or program memory.

In other examples, the memory array may comprise memory cells of a non-volatile memory. The non-volatile memory can comprise a ROM, PROM, EPROM, EEPROM, flash EEPROM, FRAM, MRAM or Phase-change RAM.

The memory array may comprise an arrangement of memory segments. A memory segment can comprise a memory cell that comprises a circuit of active and passive semiconductor components. Each memory cell can be configured to store an information unit, such as a binary value, abbreviated to bit, and to provide it for reading. For example, a memory cell contains an SRAM cell with four, six, eight, or more transistors. In other examples, a memory cell contains a DRAM cell with two transistors. The transistors can comprise field effect transistors, FET.

In addition or alternatively, a memory segment can comprise a plurality of memory cells. A quantity of data, or a memory value, that can be stored in a plurality of memory cells of a memory segment can be referred to as a word. Thus, the number of memory cells of a memory segment can correspond to a (maximum) word length. For example, the number of memory cells in a memory segment is 2, 4, 8, 16, 32, 64, or 2 raised to the n, where n is greater than 6. In other examples, the number of memory cells of a memory segment can be half the length of a word (halfword). For example, the memory array can have a word length of eight bits, and the memory segments can each be four bits in length.

Each memory segment can be assigned a respective physical address, in order to allow a unique assignment and thus a unique addressing of the respective memory segment for a read or write operation. The memory segments of the memory array can be organized into rows and columns. In addition, the memory array can be divided into banks, with each bank comprising a predetermined number of rows and/or a predetermined number of columns. As a result, a specific memory segment can be uniquely addressed using a combination of the associated row, the associated column, and, if present, the associated bank. For example, the physical address can include information about the row, the column, and, if present, the bank.

The memory array can be provided as a separate, standalone unit and/or integrated into an overall system. For example, the memory array may be part of a main memory, a secondary memory, and/or some other memory of a computer system. The computer system can be a universally usable computer system, which can include, for example, a multi-purpose computer, a PC, a mobile computing device, or a workstation.

According to an example, the memory array can be part of an embedded system that is configured and customized to execute specific operations. In some examples, the embedded system comprises a computer system. For example, the embedded system can be configured to perform a monitoring function, an open-loop control function, and/or a closed-loop control function. The embedded system can be configured to process data or signals, e.g. to encrypt, decrypt, encode, decode, or filter them. The embedded system can be implemented in application-specific hardware, such as in a motor vehicle, an aircraft, a medical device, a household appliance, a consumer electronics device, or in a mobile device. Furthermore, the embedded system can communicate with other embedded systems and/or form a larger overall system with these, e.g. for controlling parts of a motor vehicle or an aircraft. For example, a number of embedded systems can be coupled via a bus. In some examples, the memory array is configured to communicate with a microprocessor.

The memory segments of the memory device can each be suitable for storing a memory value and providing a stored memory value for retrieval. The term memory value can refer to the content of the information to be stored. The memory value can include, in particular, information that is (temporarily) stored for further processing. For example, the memory value includes an input value for an operation. For example, the input value may have been entered by a user or generated by a program. In addition, the memory value can include an output value that will be output as a result of an operation. Alternatively or additionally, the memory value comprises an intermediate result of a processor, a simple or complex operation of a switching logic, an arithmetic unit and/or an arithmetic-logical unit. Consequently, the memory value can comprise an input value, an intermediate result, and/or a result of an operation by the arithmetic and/or logical unit. The memory value can have a length of one or more bits. For example, the length of the memory value is 2, 4, 8, 16, 32, or 64 bits. In examples in which the memory array is configured to store words of a length of 2 to the nth power, the length of the memory value can be the length of a word in the memory array.

The physical address can uniquely identify an associated memory segment of the memory array. The physical address can be a binary number, i.e. a sequence of more than one bits. Alternatively or additionally, the physical address can be represented in a language interpretable by machines. For example, the physical address can be in the form of a hexadecimal number that can be translated into a corresponding binary number. The physical address can be assigned by a processor unit to a specific memory value which is to be stored in the memory array. In addition, the processor unit can use the physical address to retrieve a memory value stored in the respective memory segment of the memory array. Alternatively or in addition, a memory management unit (MMU) can use the physical address, in which case the memory management unit may be configured to provide a processor unit or running program with virtual memory that at least partially represents the memory array.

The physical address can be supplied together with the memory value in a data packet. For example, it is possible to specify which (bit) positions of the data packet identify the physical address, and which others identify the memory value. Alternatively or additionally, the physical address and the memory packet can be received via separate channels. For example, the memory value is transmitted via a data bus, while the physical address is transmitted via an address bus.

According to the method described herein, the physical address is modified to a modified physical address. In particular, the modified physical address can be from the same address space as the physical address prior to the modification. The modified physical address is assigned to a different memory segment of the memory array than the physical address prior to modification. Accordingly, the physical address can be assigned to a first memory segment of the memory array, and the modified physical address to a second memory segment of the memory array.

The modified physical address can be translated into corresponding control signals in order to address the corresponding memory segment. This operation can also be referred to as decoding. For this purpose, a control unit can be provided that is configured to receive the modified physical address and generate appropriate control signals in order to address the particular memory segment to which the modified physical address is assigned. The control unit can comprise one or more decoding units. If the memory segments of the memory array are organized in rows and columns as mentioned above, a specific memory segment can be addressed by activating the corresponding row and the corresponding column with a respective control signal. In examples in which the memory array is organized in banks, the corresponding bank can also be activated to address the corresponding memory segment.

In some examples, the individual memory segments of the memory array are connected to a respective word line and to a respective bit line. Depending on the design and structure of the memory array, the memory segments can each be connected to more than one word line and/or to more than one bit line. An individual memory segment can be addressed by applying respective predefined voltages to the word lines and the bit lines.

The method described herein causes the second memory segment to be selected instead of the first memory segment, by modifying the physical address to the modified physical address. In particular, the modified physical address can be from the same address space as the physical address. This can facilitate the translation of the physical address into the modified physical address. For example, the physical address can be modified to the modified physical address using a suitable circuit. Consequently, the modification of the physical address to the modified physical address can be effected purely in hardware. This can reduce a processing time for the modification of the physical address to the modified physical address, for example, compared to a software-based solution. For example, the hardware-based modification of the physical address to the modified physical address can be carried out within a fraction of a clock cycle, while a comparable software-based modification may require multiple clock cycles. In this case, the time indicated in clock cycles can refer to the clock cycle of a processor unit and/or a data transmission unit. This may provide a means of enabling a balanced use of the memory array by periodically changing the storage targets for the data to be stored. This allows the utilization of the memory segments to be better distributed. This can have a positive influence on the lifetime of the memory array.

Also disclosed is a device which comprises a memory array having a plurality of memory segments and a modification unit. The modification unit is configured to receive a physical address and to modify the physical address into a modified physical address. The physical address is assigned to a first memory segment of the memory array. The modified physical address is assigned to a second memory segment of the memory array. The device may be configured to carry out the method described above.

The device described herein may also be part of an embedded system. In addition or alternatively, the device can be part of a universally applicable computer system. The device, the embedded system or the computer system described herein may be capable of carrying out the method described herein.

The memory array of the device described herein may correspond to the memory array described above with respect to the method. Accordingly, the memory segments can each be configured to store and provide a memory value. As described above, a particular physical address can be assigned to each memory segment.

According to an example, the physical address can be modified to the modified physical address before the corresponding memory segments are addressed. In particular, this eliminates the operation of activating the corresponding memory segments. Furthermore, the modification of the physical address to the modified physical address can be carried out independently of a memory management unit, if present.

According to an example, the physical address comprises a group of address segments, of which a subset of the address segments can be modified to obtain the modified physical address. Therefore, the physical address can be sub-divided into the address segments. The address segments can comprise a row, a column, and, if present, a bank, which can determine a single memory segment. For example, the group of address segments comprises a first address segment that identifies the row of the memory segment, a second address segment that identifies the column of the memory segment, and a third segment that identifies the bank of the memory segment. The physical address can also comprise one or more further address segments. The order of the address segments within the physical address can depend on a particular embodiment. When modifying the physical address, one or more address segments from the group of address segments can be modified. The subset of the address segments can identify the address segments modified in this operation.

One or more address segments of the physical address can be taken from the physical address and processed separately. This process can be referred to as segmentation or parsing. For example, the physical address can be segmented into three address segments, representing the row, column, and bank of the associated memory segment. For example, the address segments can be fed individually to a particular decoder to activate the associated memory segment.

The physical address can first be segmented into a plurality of address segments, and one or more of the address segments can then be modified individually. For example, the physical address is segmented into three address segments, for the row, column, and bank of the associated memory segment, and then one, two or all three of these address segments is modified.

In other examples, the physical address can first be modified to the modified physical address and then segmented into the individual memory segments. For example, the physical address comprises three address segments for the row, column, and bank of the associated memory segment, and the physical address can be modified by one, two or all three of the address segments being modified before they are segmented into the individual address segments.

According to an example, a modification value can be provided. The physical address and the modification value can each be a binary number with N digits, where N is a positive integer. The modified physical address is obtained from an exclusive-or operation on the physical address and the modification value. For example, the exclusive-or logic operation, which can also be called an XOR operation for short, takes two binary values or two logical values as input values. The exclusive-or logic operation can be configured to output a zero or a logical False if the input values are the same. In addition, the exclusive-or logic operation can be configured to output a one or a logical True if the input values are different.

Accordingly, the device described herein may comprise an XOR gate which is configured to receive the physical address and the modification value and to output the modified physical address as the result of an XOR combination of the physical address and the modification value. In particular, one XOR gate may be provided for each of the individual bits that must be modified. Thus, the device can contain a plurality of XOR gates that are configured to modify the bits of the physical address.

According to another example, the modified physical address can be obtained from an XNOR combination of the physical address and the modification value. In other examples, one or more of the N digits of the physical address and of the modification value can be combined according to an XOR logic operation, while the remainder of the N digits can be combined according to an XNOR logic operation. In addition, one or more of the N digits of the physical address and the modification value can be combined with an inverter. In particular, one XNOR gate may be provided for each of the individual bits that must be modified. Thus, the device can contain a plurality of XNOR gates that are configured to modify the bits of the physical address. In addition, the device may contain one or more XOR gates in combination with one or more XNOR gates.

According to an example, the modification value is generated by a random number generator. The random number generator can be configured to generate a random number or a sequence of random numbers. The random number generator can comprise a deterministic mechanism, a non-deterministic mechanism, or a combination of these. For example, a random number or sequence of random numbers can be generated according to a deterministic mechanism on the basis of software. Additionally or alternatively, a random number or sequence of random numbers can be generated according to a non-deterministic mechanism on the basis of a physical process. In particular, the random generator can help to ensure that the generated modification value cycles through all permutations for an N-digit binary number as uniformly as possible.

According to an example, the modification value is determined using an integer counter. The integer counter increments or decrements at predefined operating points, for example, when re-arranged, starting, or restarting the memory array or the memory segments. In particular, the integer counter can store and provide a value for the count, i.e. a counter value. In addition, the integer counter can increment or decrement by one or more when the memory array is re-arranged, started, or restarted. For example, the counter value of the integer counter is an N-digit binary number that is increased or decreased by a value, such as one, when an event occurs that triggers a re-arrangement, a start, or a restart. In particular, in the case of an incrementing integer counter, the integer counter can be reset to a minimum value after a maximum value has been reached. The minimum value can be 0. The maximum value of the counter value can be, for example, the number of possible physical addresses or the number of bit positions of the physical address. In other examples, the maximum value of the counter value can be less than the number of possible physical addresses or less than the number of bit positions of the physical address. In the case of a decrementing integer counter, the integer counter can be reset to a maximum value after a minimum value has been reached.

Herein the terms integer counter and counter are used interchangeably unless a difference is explicitly indicated. The modification value can be identical to the counter value of the counter. In some examples, the counter value of the counter may be modified to match the configuration of the method or the device in order to obtain the modification value. For example, the maximum value of the counter value can exceed both the number of possible physical addresses and the number of bit positions of the physical address. In such a case, a circuit can be provided that converts the counter value into a value that is compatible with the addresses from the address space of the physical address. This converted value can be equal to the modification value.

In other examples, the maximum value of the counter value can be less than the number of possible physical addresses or less than the number of bit positions of the physical address.

When the memory array or the memory segments are re-arranged, stored data can be shifted to other memory locations. For example, re-arranging of the memory array can occur if the memory array has been inactive for longer than a defined duration, such as 10 minutes, 30 minutes, one hour, or several hours. The re-arrangement of the memory array can be performed by hardware and/or software for direct memory access (DMA). When starting up, restarting or resuming operation of the memory array or the memory segments, the stored data can be deleted or deletable. When such an event is detected, in addition to the counter value of the counter, the modification value can also be changed. Consequently, when re-arranging or starting or restarting the memory array or memory segments, the manner in which the physical address is modified into the modified physical address can be changed. This allows a balanced utilization of the memory array and the memory segments over an extended period of time.

Accordingly, the device described herein may comprise a counter for providing the modification value. In addition, such a counter can be configured to increment or decrement the modification value when re-arranging, starting and/or restarting the memory segments. The counter can detect an event that triggers a re-arranging, start or restart of the memory segments, and can change the modification value in response to this. The counter can comprise a volatile or non-volatile memory for storing the counter value. The counter may also comprise or be connected to a dedicated power supply to preserve the counter value even after the memory array has been powered off.

In some examples, the value of the integer counter is identical to the modification value. In other examples, the modification value can be determined uniquely from the counter value of the integer counter, for example, by superimposing another value on it. Additionally or alternatively, the modification value can be obtained from a bit-wise inversion on one, some or all of the N digits of the counter value of the integer counter. The use of an integer counter can help to ensure that the modification value cycles through all permutations for an N-digit binary number as uniformly as possible.

According to an example the modified physical address is obtained from a shift and rotation of bit values of the N-digit physical address by K positions in the direction of a first or last digit, i.e. an nth digit, of the physical address. The number K can be greater than zero and unequal to N. Thus, the modified physical address can correspond to a periodic and bitwise shift of the physical address. This allows the modified physical address to run through all possible permutations for the N-digit binary number in the address space of the physical address. Thus, the addresses in the address space of the physical address can be used as uniformly as possible.

Such a shifting of the bit values of the physical address can be carried out, for example, by means of a barrel shifter. Accordingly, the device described here may comprise a barrel shifter. The barrel shifter can be configured to output the modified physical address from a shift and rotation of bit values of the physical address by K positions in the direction of a first or an nth digit of the physical address.

A barrel shifter can comprise a circuit that is configured to receive a bit string at its input, i.e. a sequence of a plurality of bit values, and to shift them and, if necessary, rotate them by a definable number of bit positions. The shift distance, i.e. the number of bit positions by which the bit string is to be shifted, can be specified by a control circuit. The display device can comprise, in particular, a counter. In particular, the barrel shifter circuit can be designed in such a way that the bit positions are cyclically connected to each other, so that, depending on the shift direction, the lowest-valued bit position is transferred to the highest-valued bit position or vice versa. The barrel shifter can thus be configured to output a bit string that is shifted from the input bit string by one or more bit positions.

The barrel shifter can comprise a circuit with a plurality of multiplexers. For example, the barrel shifter can comprise N N-to-1 multiplexers. Alternatively or additionally, the barrel shifter can be broken down into a sequence of steps. For example, the barrel shifter can comprise N2 $\sqrt{N}$-to-1 multiplexers, where N is a square number. In other examples, the barrel shifter can comprise $N \cdot E$ d-to-1 multiplexers, where $N=d^E$. In other examples, the barrel shifter can comprise $N \cdot E$ d-to-1 multiplexers and $N \cdot G$ f-to-1 multiplexers, where $N=d^E \cdot f^G$.

In addition, the barrel shifter can comprise a decoder that converts the shift distance into a corresponding electrical signal. For example, the barrel shifter comprises a 1-from-N decoder consisting of N outputs and activates one of these outputs according to the shift distance. In other examples, the barrel shifter may comprise a plurality of decoders arranged in a cascade.

The design, method of operation, the structure and the exemplary embodiments of the barrel shifter are known to the person skilled in the art and are not explicitly described in detail here. For example, on page 1 with reference to FIG. 1, "Implementing Barrel Shifters using Multipliers" by Paul Gigliotti, in Xilinx Application Note, 17 Aug. 2004, XAPP195 (vi.i), describes several exemplary embodiments of an 8-bit barrel shifter using an 8-from-1 multiplexer. On page 3 and in FIG. 3 of the above text, examples of a 32-bit barrel shifter with thirty-two 32-to-1 multiplexers are described.

In "Design Alternatives for Barrel Shifters" by Michael J. Schulte et al., in Proc. SPIE 4791, Advanced Signal Processing Algorithms, Architectures, and Implementations XII, 6. Dec. 2002, doi: 10.1117/12.452034, the authors describe some concrete examples of the implementation of a barrel shifter. In sections 2 and 3.1 with reference to FIGS. 1 and 2, this text describes two 8-bit barrel shifters that receive eight input bits and shift them to the right (FIG. 1) or left (FIG. 2) in three steps using a total of 24 2-to-1 multiplexers. In addition, with reference to FIGS. 3 and 4, two further examples of an 8-bit barrel shifter are described, which are designed as right-shifters and are also able to shift the input bits to the left, see section 3.1. Section 3.2 with reference to FIGS. 5 and 6 describes another example which is able to shift or rotate the input bits logically or arithmetically to the left or the right.

According to an example, the number K is determined by means of an integer counter that increments or decrements when the memory array is re-arranged. The integer counter can be designed as described above. The device described herein can comprise a corresponding counter, for example as described above.

According to an example, it is determined whether the binary number of the physical address contains N zeros or N ones. If it is found that the binary number of the physical address contains N zeros or N ones, it is determined whether the number N is even or odd. If N is an even number, the binary number of the physical address is inverted at N/2 positions. If N is an odd number, the binary number of the physical address is inverted at (N−1)/2 positions. Thus, modification instructions can be provided for situations in which a shift of the incoming physical address would have no effect, since it consists of only zeros or only ones. This pre-empts a possible reduction in the effectiveness of the method described herein or the device described herein.

According to another example, it is determined whether the counter value of the integer counter is even or odd. If it is found that the binary number of the physical address contains N zeros or N ones, and that the counter value of the integer counter is odd, then the binary number of the physical address is inverted. Alternatively, the binary number of the physical address can be inverted if the counter value of the integer counter is even. Thus, exceptional conditions can be provided for situations in which a shift of the physical address would have no effect. This pre-empts a possible reduction in the effectiveness of the method described herein or the device described herein.

According to an example, the second memory segment is addressed by decoding the modified physical address. Once one of the memory segments is addressed according to the method described herein and the device described herein, a memory value can then be stored in the addressed memory segment. Furthermore, a stored memory value can be read in the same way as the above description. Thus, an operation to read the memory value can be associated with the physical address which is converted to the modified physical address before reading, thus enabling access to the memory value.

According to an example, the device described herein also comprises a processor unit and a data transmission unit. The processor unit may be configured to transfer a memory value to the memory device or to retrieve a stored memory value from the memory device. In doing so, the physical address can be assigned to the memory value. The data transmission unit can connect the processor unit to the memory device and be configured to transmit the physical address between the processor unit and the memory device. The data transmission unit can comprise a bus. The bus can consist of a data bus for transmitting a memory value and an address bus for transmitting the physical address. The data bus and the address bus can be provided as separate buses.

In the following, some examples of the present disclosure are described in detail with reference to the drawings.

BRIEF DESCRIPTION OF THE DRAWINGS

FIGS. 6A and 6B show schematic diagrams of a modification unit and a table with physical addresses and the associated modified physical addresses according to an example.

DETAILED DESCRIPTION OF THE DRAWINGS

Figure 1:
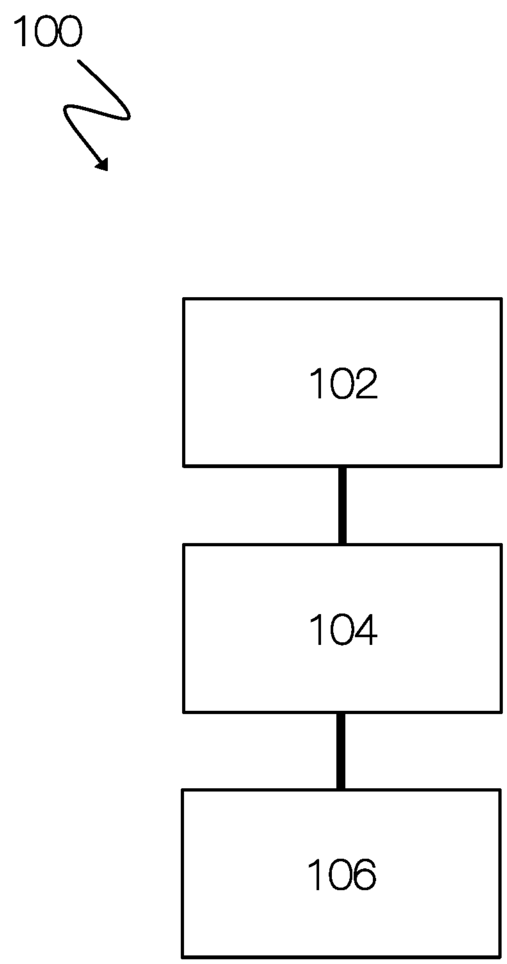
FIG. 1 shows a schematic flow diagram of a method according to an example.

FIG. 1 shows a schematic flow diagram of a method 100 for operating a memory array. The method 100 can apply to any of the examples of a memory array described herein. In particular, the method 100 may be applied to the device 200 described below.

At 102, a physical address is received which is assigned to a first memory segment of a memory array. At 104, the physical address is modified to a modified physical address that is assigned to a second memory segment of the memory array. At 106, the second memory segment can be addressed.

Figure 2A:
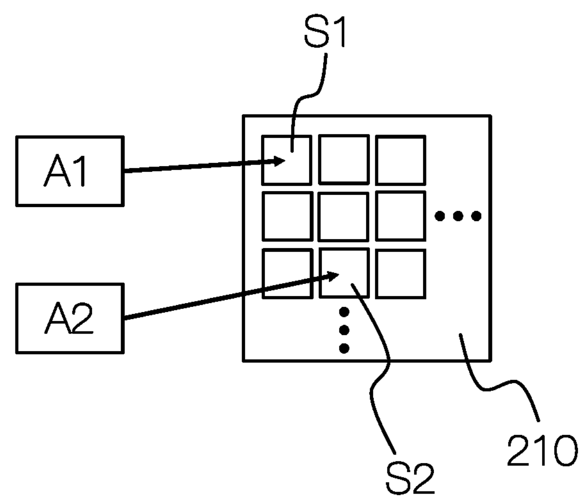
FIG. 2A to 2C show schematic diagrams of a device according to an example.
Figure 2B:
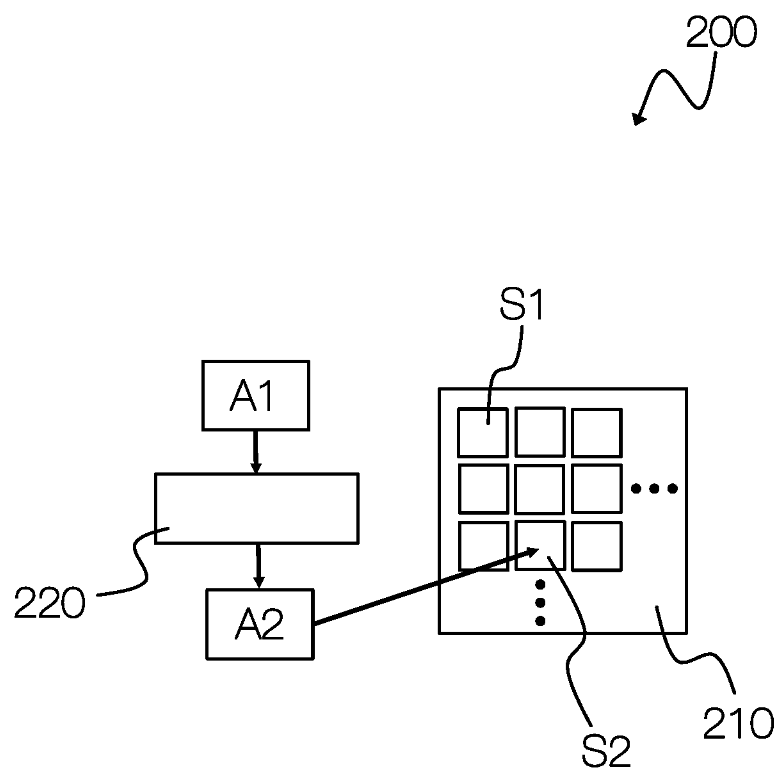
Figure 2C:
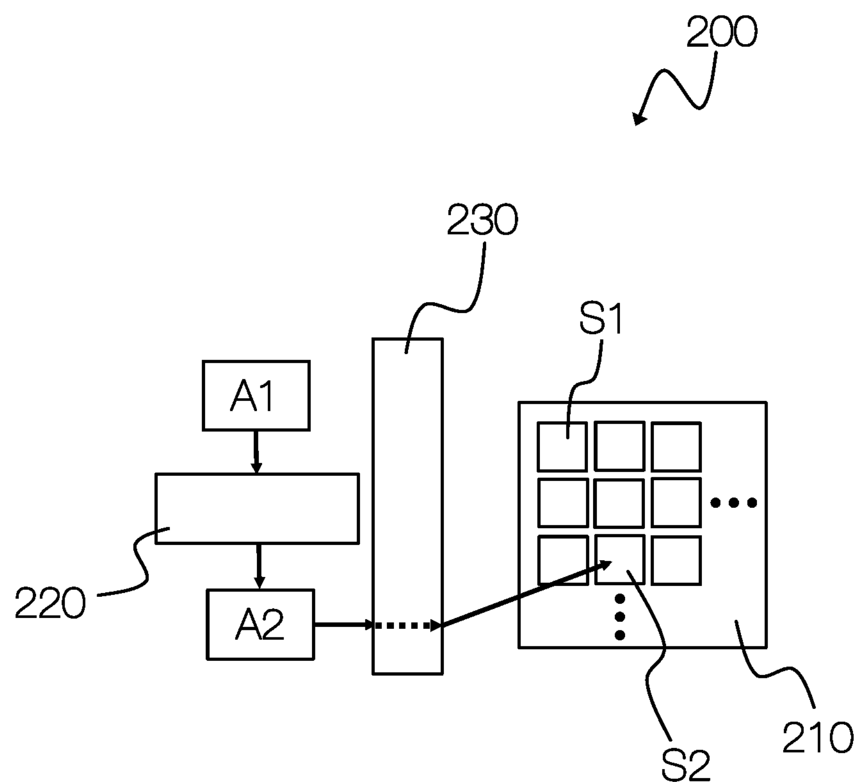

FIG. 2A to 2C show a device 200 for operating a memory array 210. The device 200 may be part of a universal computer system, part of an embedded system, or a combination of these. In particular, the device 200 can be configured to obtain a memory value for storing or buffering in the memory array 210.

The memory array 210 can be designed as described above. In particular, the memory array 210 can comprise an arrangement of multiple SRAMs, DRAMs, or other RAMs or flash memories. The memory array 210 comprises a plurality of memory segments, including the first memory segment S1 and the second memory segment S2. In FIG. 2A to 2C, the memory segments S1 and S2 are labelled with reference signs. Additional memory segments have no reference signs in order to improve the clarity.

The memory segments S1, S2 can have a uniform memory capacity, for example, 8 bits, 16 bits, 32 bits, 64 bits, or $2^n$ bits, where n is a natural number greater than 6. The memory segments of the memory array can be organized into rows and columns and also in banks.

FIG. 2A shows a schematic partial view of the device 200 and illustrates the assignment of a first physical address A1 and a second physical address A2 respectively to a first memory segment S1 and to a second memory segment S2 of the memory array 210. Accordingly, the first physical address A1 uniquely identifies the associated first memory segment S1. Likewise, the second physical address A2 uniquely identifies the associated second memory segment S2.

As shown in FIGS. 2B and 2C, the memory array 210 comprises a modification unit 220, which is configured to receive the first physical address A1 and modify it to the second physical address A2. The second physical address A2 corresponds to the modified physical address as given in the above description.

FIG. 2C also shows a control unit 230, which is configured to receive the modified physical address A2 and to generate control signals corresponding to the modified physical address A2 in order to address the associated second memory segment S2. The control unit 230 can comprise one or more of the decoding units (not explicitly shown in FIG. 2A to 2C).

Therefore, a memory segment is addressed that differs from the memory segment indicated above. A rule according to which the received physical address A1 is modified can vary over time. In this way, the local utilization of the memory segments of the memory array 210 can be distributed as evenly as possible over the entire memory array 210. This has a positive effect on the lifetime of the memory array.

Figure 3:
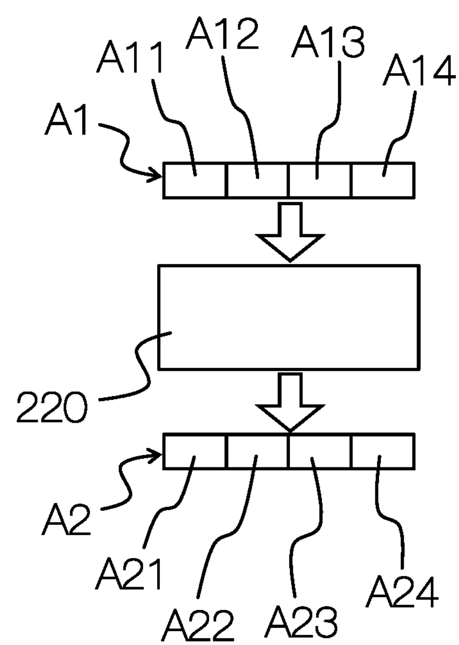
FIG. 3 shows a schematic diagram of a modification unit according to an example.

FIG. 3 schematically shows the physical address A1, which is modified to the modified physical address A2 by the modification unit 220. The physical address A1 comprises four address segments A11 to A14. For example, the address segments A11 to A13 each identify a row, a column, and a bank of the first memory segment S1. The address segment A14 can be empty, contain additional information to determine the associated memory segment, and/or include different information. Each of the address segments A11 to A14 can have a length of one or more bits. The address segments A11 to A14 can have different lengths.

The modification unit 220 can modify one, some, or all four of the four address segments A11 to A14 to a respective address segment A21 to A24. In particular, the address segments A21 to A24 of the modified physical address A2 each have the same length as the address segments A11 to A14 of the incoming physical address A1. In some examples, the physical address A1 is segmented into the address segments A11 to A14, which are individually modified by the modification unit 220. Accordingly, the modification unit 220 can comprise a plurality of modification units for a given address segment. In other examples, the modification unit 220 receives the physical address A1 contiguously and modifies it. For example, the modification unit 220 can selectively modify the address segments A11 to A14 from the contiguous physical address A1 without segmenting them.

Figure 4:
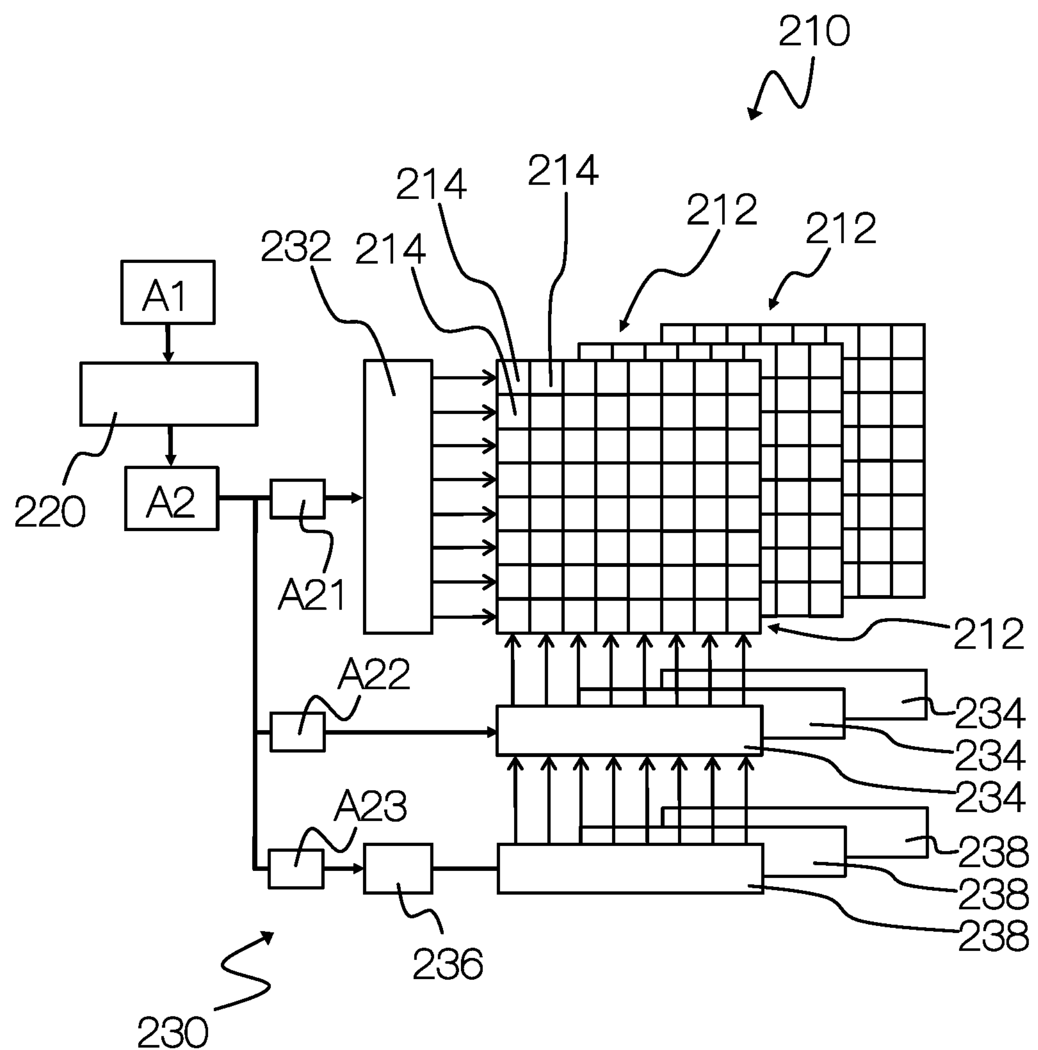
FIG. 4 shows a schematic diagram of a device according to an example.

FIG. 4 shows schematic examples of the memory array 210, the modification unit 220 and the control unit 230. The memory array 210 comprises a plurality of memory segments 214, which comprises the first memory segment S1 and the second memory segment S2, which are not explicitly shown in FIG. 4. The memory segments 214 are arranged in banks 212, rows and columns. The memory segments 214 each comprise one or more SRAM cells. The memory segments 214 are associated with a specific physical address. In FIG. 4 not all memory segments are labelled with a corresponding reference sign 214, in order to improve the clarity.

The control unit 230 comprises a row decoder 232, a column decoder 234, a bank decoder 236. In examples in which the memory array 210 comprises a plurality of memory banks 212, as shown in FIG. 4, the decoding unit 230 can comprise a plurality of column decoders 234 and a plurality of read/write circuits 238, the number of which corresponds to the number of memory banks 212. In addition, the control unit 230 can comprise a read/write circuit 238 for reading or writing a memory value.

The decoders 232 to 236 are configured to address a single memory segment 214. For example, the row decoder 232 can activate a single row by applying a predetermined voltage to that row. Similarly, the column decoder 234 and the bank decoder 236 can activate a single column as well as a single bank by changing the voltage applied there. At the same time, the read/write circuit 238 can be operated to write a memory value to the selected memory segment or to read from the selected memory segment.

The physical address A1 comprises address segments A11 to A13 which determine the row, column, and bank of the first memory segment S1. In the example of FIG. 4 the modification unit 220 can be configured to receive the physical address A1 in a contiguous form, i.e. without the physical address A1 being segmented into the address segments A11 to A13. After the modification of the physical address A1 to the modified physical address A2, the modified physical address A2 is segmented into its address segments A21 to A23 and fed to the respective decoder 232 to 236. The address segments A21 to A23 of the modified physical address determine the row, column, and bank of the associated memory segment S2 in the memory array 210. The decoding devices 232 to 236 receive the respective address segment A21 to A23 and address the associated second memory segment S2.

Figure 5:
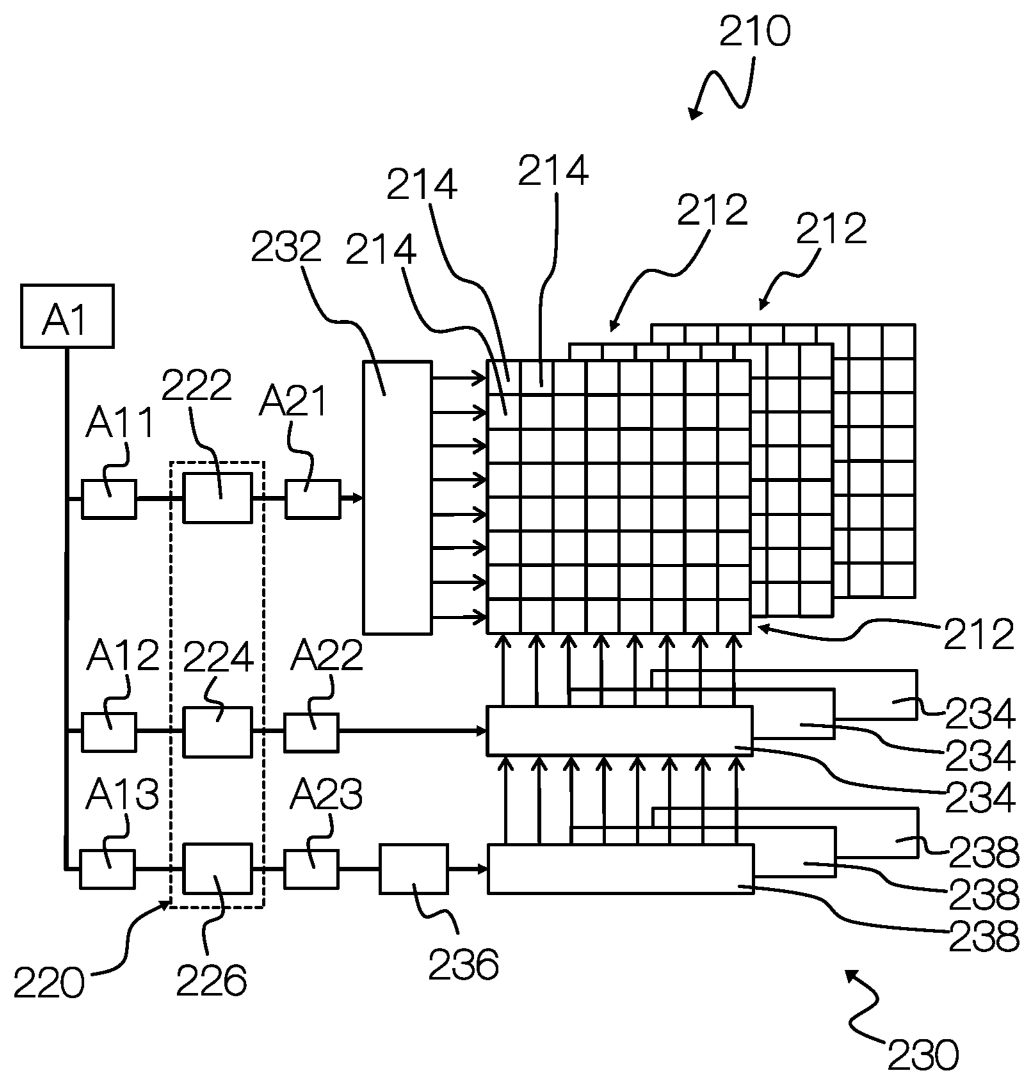
FIG. 5 shows a schematic diagram of a device according to an example.

FIG. 5 schematically shows a further example of the modification unit 220. In the example of FIG. 5, the modification unit 220 comprises a row modification unit 222, a column modification unit 224, and a bank modification unit 226. The row modification unit 222 is configured to receive the first address segment A11 of the physical address A1 and modify it to a modified first address segment A21. Accordingly, the column modification unit 224 and the bank modification unit 226 are configured to receive the respective address segment A12 and A13 and to modify them to a respective modified address segment A22 and A23.

According to the example of FIG. 5, the modification unit 220 comprises three modification units 222-226 for the row, column and bank. In other examples, the modification unit 220 can comprise only one or two of the modification units 222-226, in order to selectively modify the row, column and/or bank of the physical address A1.

Figure 6A:
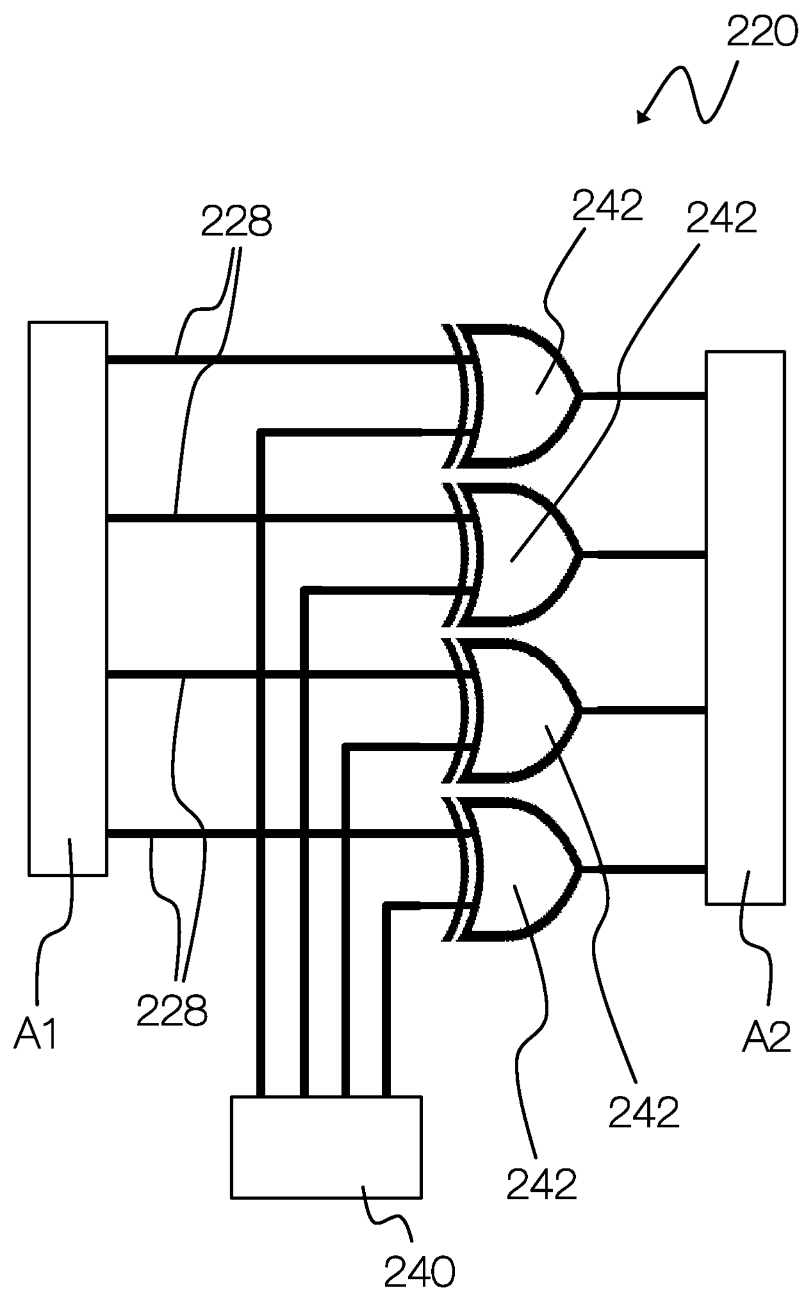

FIGS. 6A and 6B show a schematic example of a modification unit 220. The modification unit according to the example of FIGS. 6A and 6B comprises a counter 240 and a plurality of XOR gates 242. The number of XOR gates 242 can correspond to the number of bit positions to be modified in the incoming physical address A1. Alternatively or additionally, the number of XOR gates 242 can correspond to the number of bit positions of an address segment of the incoming physical address A1 which is to be modified. In FIGS. 6A and 6B, the incoming physical address A1 is shown by way of an example as a four-digit binary number, and the modification unit 220 comprises four XOR gates 242.

The counter 240 comprises a circuit for storing and incrementing a counter value as an N-digit binary number. In another example, the counter 240 can comprise a circuit for storing and decrementing a counter value as an N-digit binary number. The length N of the binary number of the counter value corresponds to the number of bit positions of the incoming physical address A1. The counter value of the counter 240 increments or decrements upon a re-arranging, start or restart of the memory array 210. In addition, the counter 240 can be designed as described above.

Each XOR gate 242 is configured to modify a respective bit of the physical address A1. The XOR gates 242 receive a respective bit of the physical address A1 at their input, as illustrated by lines 228, and a respective bit of the counter value of the counter 240. In the example of FIG. 6A, the counter value of the counter 232 corresponds to a modification value M, see FIG. 6B. In another example, which is not explicitly shown, the counter value can be modified to a modification value M and fed to the XOR gates 242. In an example that is not shown, one or more of the XOR gates 242 can each be replaced by an XNOR gate.

FIG. 6B shows a tabulated representation of modified physical addresses A2, which result from an exclusive-or combination of a four-digit binary physical address A1 with a four-digit binary counter value as the modification value M. In the example of FIGS. 6A and 6B the physical address A1 comes from a linear address space, in which a total of sixteen addresses from 0 to 15 are sequentially numbered linearly, represented as four-digit binary numbers (0000 to 1111) in the first column of the table. In this example, the modification value M can assume a value between 0 and 15, which are shown as four-digit binary numbers (0000 to 1111) in the top row of the table of FIG. 6B. The values starting from the second row and from the second column of the table represent the modified physical address A2 as results of an exclusive-or combination of the incoming physical address A1 with the respective modification value M.

In the second column of the table of FIG. 6B the values from an exclusive-or combination of the physical address A1 with a modification value M of (0000) are shown. Consequently, in this case, the modified physical address A2 is identical to the incoming physical address A1. In the last column of the table the values from an exclusive-or combination of the physical address A1 with a modification value M of (1111) are shown, which corresponds to an inversion of the physical address A1. By the exclusive-or combination of the counter value of the counter 240 with the physical address A1, the physical address A1 is modified in a unique way to a modified physical address A2.

As described above, the modification value M together with the counter value of the counter 240 can be changed when the memory array 210 or the device 200 is re-arranged, started, or restarted. The maximum value for the counter value of the counter 240 can correspond to the number of possible physical addresses. For example, starting from 0000, the modification value M is incremented by one when the memory array 210 is re-arranged, started, or restarted. If the modification value M has the maximum value of ml (or 15 in decimal notation), the modification value M can be reset to 0000 (or 0 in decimal notation) when the memory array 210 is re-arranged, started, or restarted. In other examples, the modification value M can be increased by more than one. The value shift of the modification value M can be varied with time or as desired. In other examples, the modification value M can be decreased by one when the memory array 210 is re-arranged, started, or restarted, and reset to 1111 if the modification value M is 0000 and is due to be further reduced.

In addition to or as an alternative to the counter 240, a random number generator can be provided, which is configured to generate a four-digit random binary number. Thus, the modification value M can correspond to the four-digit random binary number from the random number generator. In other examples, the modification value M can be obtained from a combination of the counter value of the counter 240 with the four-digit random binary number from the random number generator.

Figure 7A:
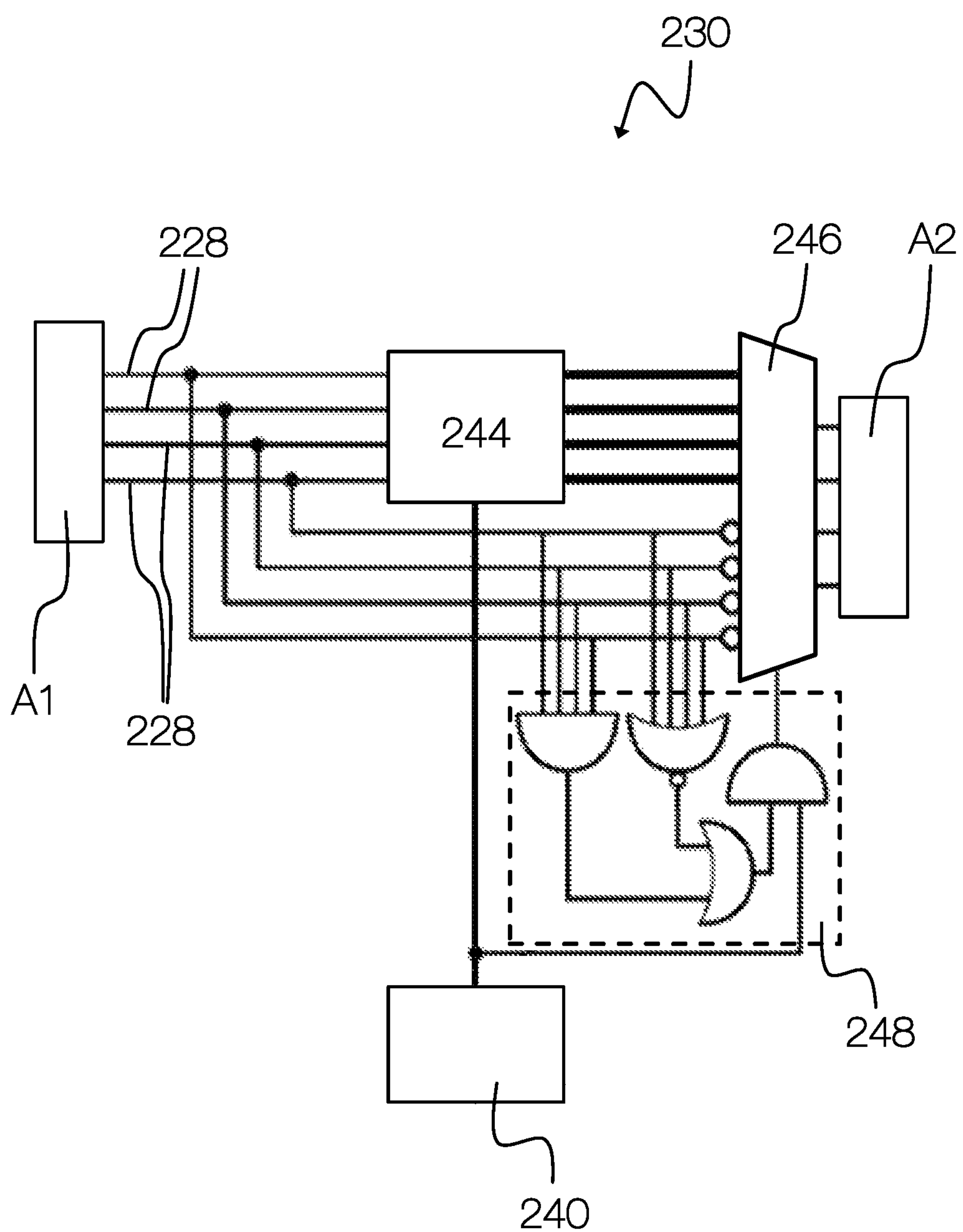
FIGS. 7A and 7B show schematic diagrams of a modification unit and a shift and rotation of a physical address to modified physical addresses, according to an example.
Figure 7B:
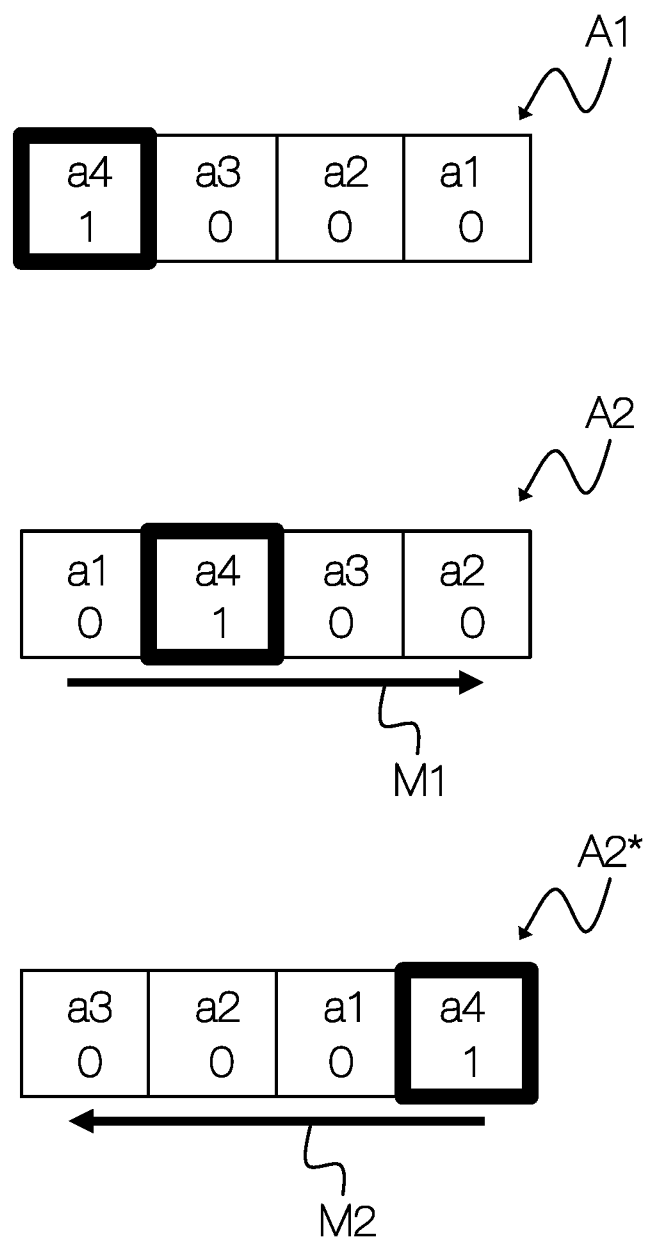

FIG. 7A shows a further example of a modification unit 220. The modification unit 220 comprises a counter 240 and a barrel shifter 244. The counter 240 and/or the barrel shifter 244 can be configured as described above. The barrel shifter 244 can receive the physical address A1 in a bitwise manner, as illustrated by the lines 228. In FIGS. 7A and 7B the physical address A1 and the modified physical address A2 are represented by way of example as four-digit binary numbers. Alternatively or additionally, the barrel shifter 244 can modify a part or an address segment of the incoming physical address A1.

The barrel shifter 236 can also receive the counter value of the counter 240. From the counter value of the counter 240 the barrel shifter 244 can determine a number of bit positions by which the bits of the physical address A1 are to be shifted. The result of the shift can correspond to the modified physical address A2.

In addition or as an alternative, a random number generator can be provided that generates a four-digit random binary number. Thus, the counter value can be replaced by the four-digit random binary number of the random number generator or be superimposed with it. The random number generator can be implemented as described above.

The modification unit 220 can also comprise a multiplexer 246 and a detection circuit 248. The detection circuit 248 can be configured to detect whether the binary number of the physical address A1 consists of only ones or only zeros. In the example of FIG. 7A the detection circuit 248 comprises an AND-gate and a NOR-gate, which each receive the bits of the physical address A, an OR gate that combines the output values of these gates, and another AND gate that combines the output value of the OR gate with the counter value of the counter 240 and feeds an output value into the multiplexer 246. Therefore, the multiplexer 246 performs an inversion of the bits of the physical address A1 if all bits of the physical address are zeros or ones, and if the counter value of the counter 240 is an odd number. In further examples, the binary number of the physical address A1 can be inverted at two of the four bit positions.

FIG. 7B shows the incoming physical address A1 as well as two examples of modified addresses A2 and A2*, which can be obtained using the modification unit 220 of FIG. 7A. The modified addresses A2 and A2* are obtained by shifting the four-digit binary number of the physical address A1 in a direction M1, M2 respectively.

The binary number of the physical address A1 comprises four bit positions with bit values a1 to a4, where a1 is the least significant bit and a4 is the most significant bit of the physical address A1. In the example in FIG. 7B the incoming physical address A1 is a four-digit binary number 1000, which corresponds to a value of 8 in decimal representation.

In an example, the binary number of the physical address A1 is shifted by one bit position to the right, as illustrated by arrow M1. This can correspond to a shift of the bit values a1 to a4 of the physical address A1 by one bit position towards the least significant bit position, as shown by the corresponding modified physical address A2. In this case, the bit a1 of the least significant bit position of the physical address A1 is rotated to the left and placed at the most significant bit position. The remaining bit values a2 to a4 are shifted one bit to the right, resulting in a value of 0100 (4 in decimal representation).

In another example, the binary number of the physical address A1 is shifted one bit position to the left, as illustrated by arrow M2. This can correspond to a shift of the bit values a1 to a4 of the physical address A1 by one bit position towards the most significant bit position, as shown by the corresponding modified physical address A2*. In this case, the bit a4 of the most significant bit position of the physical address A1 is rotated to the right and placed at the least significant bit position. The remaining bits a1 to a3 are shifted one bit to the left, resulting in a value of 0001 (1 in decimal representation).

The examples of FIG. 7B show a shift and rotation of the bit values of the physical address A1 by one bit position in each case. In other examples, not shown in FIG. 7B, the modification unit 220 can be configured to shift the bit values of the physical address by more than one bit position to the left or to the right.

Figure 8:
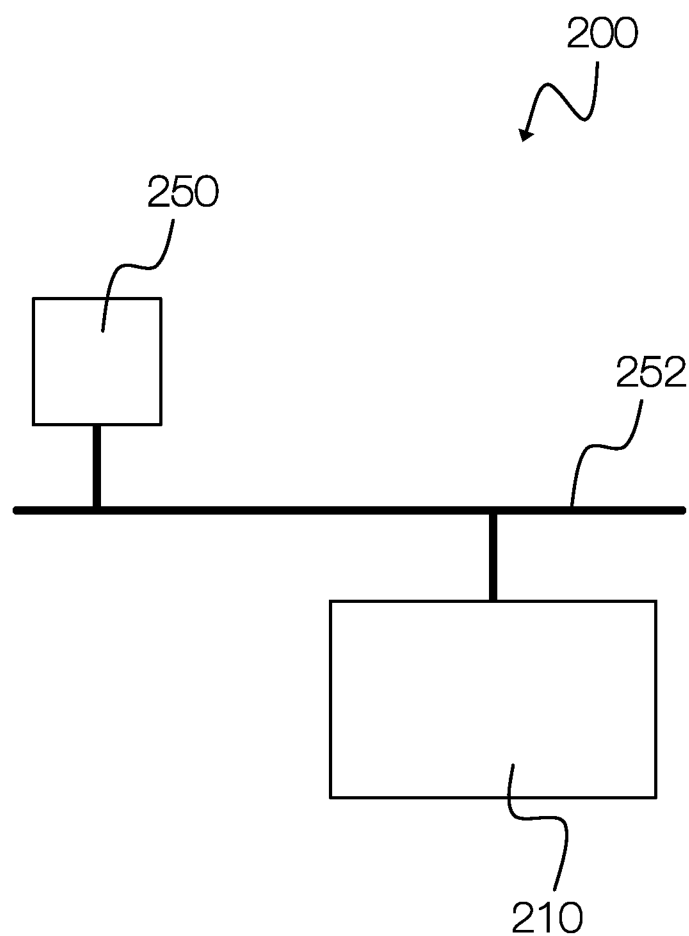
FIG. 8 shows a schematic diagram of a device according to an example.

FIG. 8 shows a device 200 according to another example. Accordingly, the device 200 can comprise a processor unit 250 and a data transmission unit 252. The processor unit 250 may be configured, in particular, to transfer a memory value to the memory device 210 or to retrieve a memory value from the memory device 210. The data transmission unit 252 can connect the processor unit 250 to the memory device 210 and be configured to transmit the physical address A1 between the processor unit 250 and the memory device 210.

The data transmission unit 252 can comprise a data bus for transmitting the memory value and an address bus for transmitting the physical address between the processor unit 250 and the memory array 210.

LIST OF REFERENCE SIGNS

100 method
102-106 method steps
200 device
210 memory array
212 memory bank
214 memory cell
220 modification unit
222 row modification unit
224 column modification unit
226 bank modification unit
228 data line
230 decoding unit
232 row decoder
234 column decoder
236 bank decoder
238 read/write circuit
240 counter
242 XOR gate
244 barrel shifter
246 multiplexer
248 detection circuit
250 processor unit
252 data transmission unit
A1 physical address
A11-A14 address segment
A2, A2* modified physical address
A21-A24 address segment
a1-a4 bit value
M modification value
S1, S2 memory segment

What is claimed is:

1. A Method of operating a memory array, the method comprising the following steps:
receiving a physical address, the physical address being assigned to a first memory segment of a memory array;
modifying the physical address to a modified physical address, the modified physical address being assigned to a second memory segment of the memory array; and
addressing the second memory segment.

2. Method according to claim 1,
wherein the physical address comprises a group of address segments,
wherein the modified physical address is obtained from a modification of a subset of the address segments.

3. Method according to claim 1, further comprising:
providing a modification value,
wherein the physical address and the modification value are each a binary number with N digits,
where N is a positive integer, and
wherein the modified physical address is obtained from an exclusive-or combination of the physical address and the modification value.

4. Method according to claim 3, further comprising:
determining the modification value by means of an integer counter that increments or decrements in response to at least one of: a re-arrangement, a start or a restart of the memory array.

5. Method according to claim 3, further comprising:
determining the modification value using a random number generator.

6. Method according to claim 1 wherein the physical address is a binary number with N digits,
where N is a positive integer, and
wherein the modified physical address is obtained from a shift and rotation of bit values of the physical address by K positions towards a first or last digit of the physical address, and
where K is a positive integer greater than zero and not equal to N.

7. Method according to claim 6, further comprising:
determining K by means of an integer counter that increments or decrements upon at least one of: a re-arrangement, a start or a restart of the memory array.

8. Method according to claim 6, further comprising:
determining K using a random number generator.

9. Method according to claim 6, further comprising:
determining whether the binary number of the physical address contains N zeros or N ones;
if the binary number of the physical address contains N zeros or N ones, inverting the binary number of the physical address if the integer counter is an odd number.

10. Method according to claim 1, further comprising:
decoding the modified physical address to address the second memory segment.

11. Device, comprising:
a memory array having a first memory segment and a second memory segment;
a modification unit for receiving a physical address, wherein the physical address is assigned to the first memory segment,
wherein the modification unit is configured to modify the physical address to a modified physical address, the modified physical address being assigned to the second memory segment.

12. Device according to claim 11,
wherein the physical address comprises a group of address segments,
wherein the modification unit is configured to modify a subset of the address segments to obtain the modified physical address.

13. Device according to claim 11, further comprising:
a counter for providing a modification value, wherein the physical address and the modification value are each a binary number with N digits; and
an XOR gate for receiving the physical address and the modification value and for outputting the modified physical address as a result of an XOR combination of the physical address and the modification value.

14. Device according to claim 13,
wherein the counter is configured to increment or decrement the modification value upon at least one of: re-arranging, starting or restarting of the memory array.

15. Device according to claim 11,
wherein the physical address is a binary number with N digits,
wherein the device also comprises a barrel shifter, which is configured to output the modified physical address from a shift and rotation of bit values of the physical address by K positions towards a first digit or a last digit of the physical address, where K is a positive integer greater than zero and not equal to N.

16. Device according to claim 11, further comprising:
a control unit for activating the memory segments.

17. Device according to claim 11, further comprising:
a processor unit configured to transmit a memory value to the memory device or to retrieve the memory value from the memory device, the physical address being assigned to the memory value; and a data transmission unit, which connects the processor unit to the memory device and is configured to transmit the physical address between the processor unit and the memory device.

18. Device, comprising:

a memory array having a first memory segment and a second memory segment, wherein a physical address is assigned to the first memory segment, and a modified physical address is assigned to the second memory segment;

a counter for providing a modification value, wherein the physical address and the modification value are each a binary number with N digits; and a modification unit to modify the physical address to the modified physical address according to the modification value.

19. Device according to claim 18, wherein the modification unit comprises N XOR gates each to receive a respective one of the N digits of the binary number of the physical address and a respective one of the N digits of the modification value from the counter, wherein each of the N XOR gates outputs a respective one digit of a binary number of the modified physical address.

20. Device according to claim 18, wherein the modification unit comprises a barrel shifter to receive the binary number of the physical address and the modification value from the counter, and to output the modified physical address from a shift and rotation of bit values of the physical address by K positions towards a first digit or a last digit of the physical address, where K is a positive integer greater than zero and not equal to N, wherein the device further comprises a detection circuit to detect whether the binary number of the physical address consists of only ones or only zeros.

* * * * *